United States Patent
Lee et al.

(10) Patent No.: US 7,814,394 B2
(45) Date of Patent: Oct. 12, 2010

(54) POST VITERBI ERROR CORRECTION APPARATUS AND RELATED METHODS

(75) Inventors: Jun Lee, Jeonju-si (KR); Takao Sugawara, Kanagawa-ken (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 934 days.

(21) Appl. No.: 11/655,969

(22) Filed: Jan. 22, 2007

(65) Prior Publication Data

US 2007/0174755 A1    Jul. 26, 2007

(30) Foreign Application Priority Data

Jan. 23, 2006    (KR) .................. 10-2006-0006818

(51) Int. Cl.
*H03M 13/00*    (2006.01)
*G06F 11/00*    (2006.01)

(52) U.S. Cl. ....................... 714/758; 714/809

(58) Field of Classification Search ................ 714/755, 714/758, 795, 799, 809

See application file for complete search history.

(56) References Cited

U.S. PATENT DOCUMENTS

| | | | |
|---|---|---|---|
| 5,577,053 A | 11/1996 | Dent | |
| 7,325,183 B2 * | 1/2008 | Deolalikar | 714/777 |
| 2008/0148129 A1 * | 6/2008 | Moon et al. | 714/758 |

FOREIGN PATENT DOCUMENTS

| | | |
|---|---|---|
| JP | 09-046241 | 2/1997 |
| KR | 1020010011516 A | 2/2001 |

OTHER PUBLICATIONS

Park et al., High rate error correcting codes targeting dominant error patterns, Oct. 2006, IEEE, Trans on Magnetics, vol. 42, No. 10, p. 2573-2575.*

Park et al., Imposing a k Constraint in Recording Systems Employing Post-Viterbi Error Correction, IEEE Transactions on Magnetics, Oct. 2005, pp. 2995-2997, vol. 41, No. 10.

* cited by examiner

*Primary Examiner*—Shelly A Chase
(74) *Attorney, Agent, or Firm*—Volentine & Whitt, PLLC

(57) ABSTRACT

A Post-Viterbi processor generates a plurality of candidate codewords based on a plurality of dominant error patterns for a particular communication channel. The Post-Viterbi processor selects one among the candidate codewords as a corrected codeword upon determining that the candidate codeword is error free.

14 Claims, 7 Drawing Sheets

| CONFIDENCE VALUE | ERROR EVENT | | | | | | ERROR POSITION | | | | | |
|---|---|---|---|---|---|---|---|---|---|---|---|---|
| 4.8694e-001 (LARGEST) | 2 | -2 | 2 | -2 | 0 | 0 | 705 | 706 | 707 | 708 | 0 | 0 |
| 4.8214e-001 | 2 | -2 | 2 | 0 | 0 | 0 | 715 | 716 | 717 | 0 | 0 | 0 |
| 3.9771e-001 | 2 | -2 | 2 | -2 | 2 | -2 | 709 | 710 | 711 | 712 | 713 | 714 |
| 3.9625e-001 | 2 | -2 | 2 | -2 | 2 | 0 | 718 | 719 | 720 | 721 | 722 | 0 |
| 3.6407e-001 | 2 | -2 | 0 | 0 | 0 | 0 | 767 | 768 | 0 | 0 | 0 | 0 |
| 3.5399e-001 | 2 | -2 | 0 | 2 | -2 | 0 | 713 | 714 | 0 | 716 | 717 | 0 |

FIG. 5

| CONFIDENCE VALUE | ERROR EVENT | | | | | | ERROR POSITION | | | | | |
|---|---|---|---|---|---|---|---|---|---|---|---|---|
| 4.8694e-001(LARGEST) | 2 | -2 | 2 | -2 | 0 | 0 | 705 | 706 | 707 | 708 | 0 | 0 |
| 4.8214e-001 | 2 | -2 | 2 | 0 | 0 | 0 | 715 | 716 | 717 | 0 | 0 | 0 |
| 3.9771e-001 | 2 | -2 | 2 | -2 | 2 | -2 | 709 | 710 | 711 | 712 | 713 | 714 |
| 3.9625e-001 | 2 | -2 | 2 | -2 | 2 | 0 | 718 | 719 | 720 | 721 | 722 | 0 |
| 3.6407e-001 | 2 | -2 | 0 | 0 | 0 | 0 | 767 | 768 | 0 | 0 | 0 | 0 |
| 3.5399e-001 | 2 | -2 | 0 | 2 | -2 | 0 | 713 | 714 | 0 | 716 | 717 | 0 |

US 7,814,394 B2

POST VITERBI ERROR CORRECTION APPARATUS AND RELATED METHODS

BACKGROUND OF THE INVENTION

1. Field of the Invention

Embodiments of the invention relate generally to a Post-Viterbi error correction method. More particularly, embodiments of the invention relate to a Post-Viterbi error correction method adapted to reduce a probability of mis-correction and an apparatus adapted to implement the method.

A claim of priority is made to Korean Patent Application No. 10-2006-0006818, filed on Jan. 23, 2006, the disclosure of which is incorporated by reference in its entirety.

2. Description of Related Art

Error detection and correction techniques play an important role in many data transmission systems where noise is present and accuracy matters. For example, in many electronic data transmission systems, error detection and correction is achieved by encoding data using some form of redundant data before transmitting the data across a channel and then using the redundant data to aid a process of decoding the data.

One common technique used for error correction is known as a cyclic redundancy check (CRC). In a cyclic redundancy check, data to be transmitted across a noisy channel is multiplied by a generator polynomial to form a codeword.

In this written description, the term "transmitted codeword" will denote an original codeword to be transmitted across a channel and the term "detected codeword" will denote the codeword as detected by a receiving device after the codeword has been transmitted across the channel. In addition, the generator polynomial can be referred to more generically as an error detection code, which can be designed from various types of polynomials.

A syndrome is computed from the detected codeword by dividing the detected codeword by the generator polynomial. A detected codeword without errors yields an all-zero syndrome, and a detected codeword containing errors yields a syndrome that is not all-zero.

A post-Viterbi processor is often used to find a most probable type of error pattern and a start position for the error pattern within a detected codeword by estimating an amount of correlation between known forms of error patterns and an estimated error signal.

The estimated error signal is typically computed as a difference between an output signal of an equalizer and a signal generated by convolution of an output of a Viterbi decoder with a partial response polynomial. The partial response polynomial is a signal that facilitates a digitalization of an analog readback channel by reshaping the analog readback channel into a known partial response using an equalizer. The Viterbi decoder computes the detected codeword from a reshaped, digitalized equalizer output.

Due to noise and an imperfect equalizer, the detected codeword may contain errors. Accordingly, the error signal is obtained by subtracting the equalizer output from the signal computed by convolving the Viterbi decoder output with the partial response polynomial.

As an example, FIG. 1 shows one type of Post-Viterbi processor. Referring FIG. 1, data is encoded by an error detection coding (EDC) encoder (not shown) and transmitted through a channel which may contain noise. An equalizer unit 106 reshapes a readback channel output into a sequence which is matched to a partial response $P(D)$, where "D" is a delay variable in a digital sequence, e.g., $P(D)=1+6D+7D^2+2D^3$.

A partial response maximum likelihood (PRML) unit 108 detects a transmitted codeword and provides an output. An error signal 'e' is generated by subtracting an output of equalizer unit 106 and the output of PRML unit 108, convolved with partial response $P(D)$.

An EDC decoder unit 112 computes a syndrome to check for the presence of errors in the detected codeword. A matched-filters unit 114 comprises a plurality of error pattern event matched filters, each corresponding to a dominant error pattern and used to detect whether the detected codeword contains one of the dominant error pattern. The term "dominant error pattern" here denotes an error pattern with a relatively high likelihood of occurrence among potential error patterns for a particular communication channel.

Each error-pattern matched filter calculates a likelihood value, or a confidence value, that an error pattern occurred in the detected codeword at a particular position. A select maximum unit 116 then selects an error pattern and associated start position having a maximum likelihood among the error patterns and start positions calculated by the error pattern matched filters. Then, based on the information about the most likely error pattern and start location, a correction unit 118 corrects the error pattern.

As an example of how the post-Viterbi processor works, assume that "a" is recorded data, "a prime" (a') is recorded data decoded by PRML 108 and $P(D)$ is a partial response polynomial. An output signal "y" of equalizer unit 106 and an error signal "e" can be expressed as $y=a*p+n$ and $e=(a-a')*p+n$, respectively, where "p" denotes a transfer function of a readback channel between the medium where the recorded data is stored and the output of the equalizer, "n" denotes noise in the readback channel, and * denotes a convolution operation.

A confidence value calculated by matched filters unit 114 can be expressed as an equation of $P^{-1}(D)*E^{-1}(D)$, where, $P^{-1}(D)$ and $E^{-1}(D)$ denote time reversals of the partial response polynomial and an error pattern, respectively, and * denotes an convolution operation. Respective error pattern matched filters in matched filters unit 114 are used to calculate a probability of each error pattern, e.g., a confidence value, at every position within a detected codeword.

Select maximum unit 116 produces an error pattern and an error start position based on the largest confidence value among outputs of matched filters unit 114. Correction unit 118 then corrects a most likely error pattern according to the error pattern and error start position output from select maximum unit 116.

In channels with a relatively high incidence of errors (i.e., "interference-dominant" channels), errors tend to occur in specific patterns. For example, if a transmitted codeword is [1, −1, 1, −1, 1, 1, −1, 1, −1, −1], and a detected codeword is [1, −1, 1, −1, 1, −1, 1, −1, −1, −1], then an error pattern [0, 0, 0, 0, 0, 2, −2, 2, 0, 0] with a with a specific pattern denoted [2, −2, 2] has occurred.

FIG. 2 is a flow chart illustrating a conventional Post-Viterbi error correction method.

Referring to FIG. 2, an operation S202 is performed to determine whether or not an error pattern exists in a detected codeword. In operation S202, the detected codeword is divided by a generator polynomial to produce a syndrome. If the syndrome is all-zero, then the detected codeword presumably contains no errors. However, if the syndrome is not all-zero, the detected codeword presumably contains some error.

If the detected codeword is determined to be error free, a data recovery process is performed in an operation S206 to recover original data from which the detected codeword was formed. The data recovery process typically removes redundant bits that were added to the data by the EDC encoder to form a transmitted codeword.

On the other hand, if the detected codeword is determined to contain errors in operation S202, a Post-Viterbi error correction process is performed in an operation S204 to correct the errors.

Operation S204 is performed under a condition of K=1, where "K" denotes a maximum number of different error patterns which are assumed to possibly exist within the detected codeword. The relation of K≦E should be satisfied, where "E" denotes a number of error pattern matched filters included in the post-Viterbi processor.

In operation 204, confidence values are computed for all possible error patterns with respect to every bit of the detected codeword using respective error pattern matched filters corresponding to respective error patterns. Here, each error pattern matched filter is configured according to dominant error patterns occurring in the readback channel. Errors in the detected codeword are corrected according to the most likely error pattern that occurred and the most likely start position of the error pattern, as determined by the post-Viterbi processor.

Unfortunately, conventional Post-Viterbi error correction methods, such as that shown in FIG. 2, have a high possibility of mis-correction. A mis-correction occurs where either an incorrect error pattern is corrected, or an error pattern is corrected at the wrong start position.

For example, in perpendicular magnetic recoding (PMR), an error pattern ±[2,−2] is often detected as ±[2,−2,2] or ±[2,−2,0,2,−2]. Another dominant error pattern ±[2,−2,2] is often detected as ±[2,−2] or ±[2,−2,2,−2,2,−2]. Similarly, error pattern ±[2,−2,2,−2,2] and ±[2,−2,2,−2,2,−2] are also commonly mis-detected. On the other hand, with regard to mis-corrected start positions, dominant error patterns ±[2,−2] and ±[2,−2,2] are often corrected as ±[2,0,−2] or ±[2,0,0,−2].

FIG. 3 shows an example of mis-correction by the Post-Viterbi processor of FIG. 1. In this example, the Post-Viterbi processor performs error detection and correction based on the following six dominant error patterns [2,−2], [2,−2,2], [2,−2,2,−2], [2,−2,0,2,−2], [2,−2,2,−2,2], and [2,−2,2,−2,2,−2]. Referring to FIG. 3, an actual error pattern [2,−2, 2] has occurred with an actual error position [715, 716, 717], and K=1 in a detected codeword. However, an error pattern [2,−2,2,−2] with error position is [705,706,707,708] has a largest confidence value among the six dominant error patterns and therefore is determined to be a predicted error pattern by the Post-Viterbi processor.

Since the predicted error pattern is not the same as the actual error pattern, a mis-prediction has occurred, and as a result, the Post-Viterbi processor will perform a mis-correction. More particularly, error correction corresponding to the error pattern [2, −2, 2, −2] will be performed with respect to 705th through 708th bits of the detected codeword.

Unfortunately, mis-corrections such as these may have a significant impact on the bit error rate (BER) performance of the Post-Viterbi processor.

SUMMARY OF THE INVENTION

Selected embodiments of the invention provide Post-Viterbi error correction methods adapted to reduce the probability of mis-correction. In addition, selected embodiments of the invention also provide apparatuses for performing the Post-Viterbi error correction methods.

According to one embodiment of the invention a method of correcting one or more errors in a detected codeword comprises generating a first candidate codeword by applying a first error pattern to a first position in the detected codeword based on a likelihood that the first error pattern exists in the detected codeword at the first position, and detecting an error in the first candidate codeword. The method further comprises generating a second candidate codeword by applying a second error pattern to a second position in the detected codeword based on a likelihood that the second error pattern exists in the detected codeword at the second position, determining whether the second candidate codeword contains an error, and upon determining that the second candidate codeword does not contain an error, selecting the second candidate codeword as a corrected codeword.

According to another embodiment of the invention, a method of correcting one or more errors in a detected codeword comprises generating N candidate codewords (n>1) by applying a plurality of error patterns to the detected codeword at a corresponding plurality of respective start positions, determining whether any of the N candidate codewords is free of errors, and upon determining that an i-th candidate codeword among the N candidate codewords is free of errors, generating the i-th candidate codeword as a corrected codeword.

According to yet another embodiment of the invention, a Post-Viterbi processor is provided. The Post-Viterbi processor is adapted to correct an error pattern in a detected codeword by applying dominant error patterns of a communication channel to the detected codeword. The Post-Viterbi processor comprises an error detection code (EDC) decoder adapted to detect whether the detected codeword contains errors, a matched filters unit comprising a plurality of error pattern matched filters, each adapted to compute a confidence value corresponding to a likelihood that corresponding error pattern exists in the detected codeword, a candidate codeword generation unit adapted to generate a plurality of candidate codewords based on the confidence values computed by the error pattern matched filters, and a correction unit adapted to generate one of the plurality of candidate codewords as a corrected codeword upon a determination by the EDC decoder that the one of the plurality of candidate codewords does not contain errors.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings:

FIG. 5 is a table illustrating results of using the error correction method illustrated in FIG. 4;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figures 2, 3:
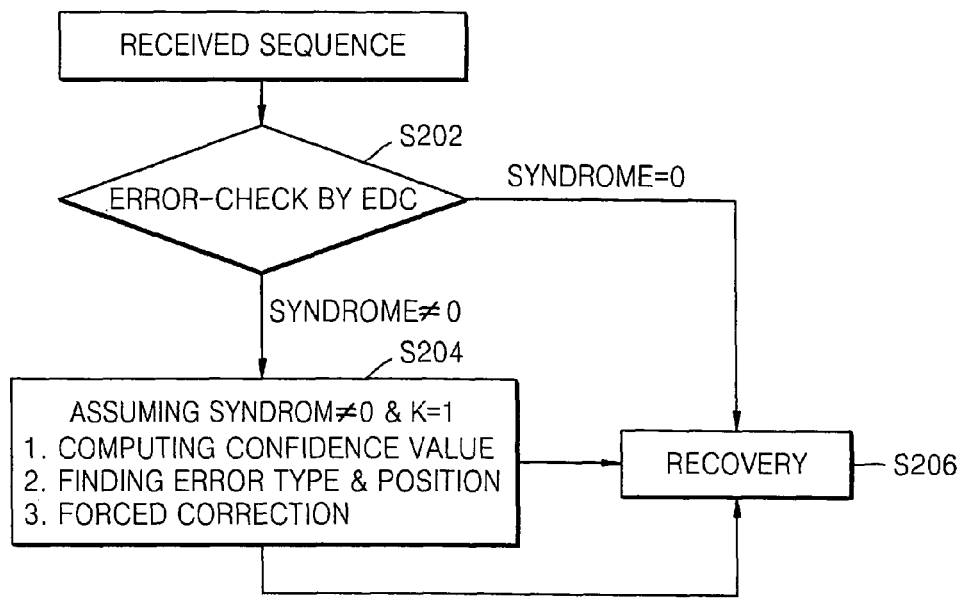
FIG. 2 is a flowchart illustrating a conventional Post-Viterbi error correction method.
FIG. 3 is a table illustrating and example of a mis-correction made by the conventional Post-Viterbi processor.
Figure 4:
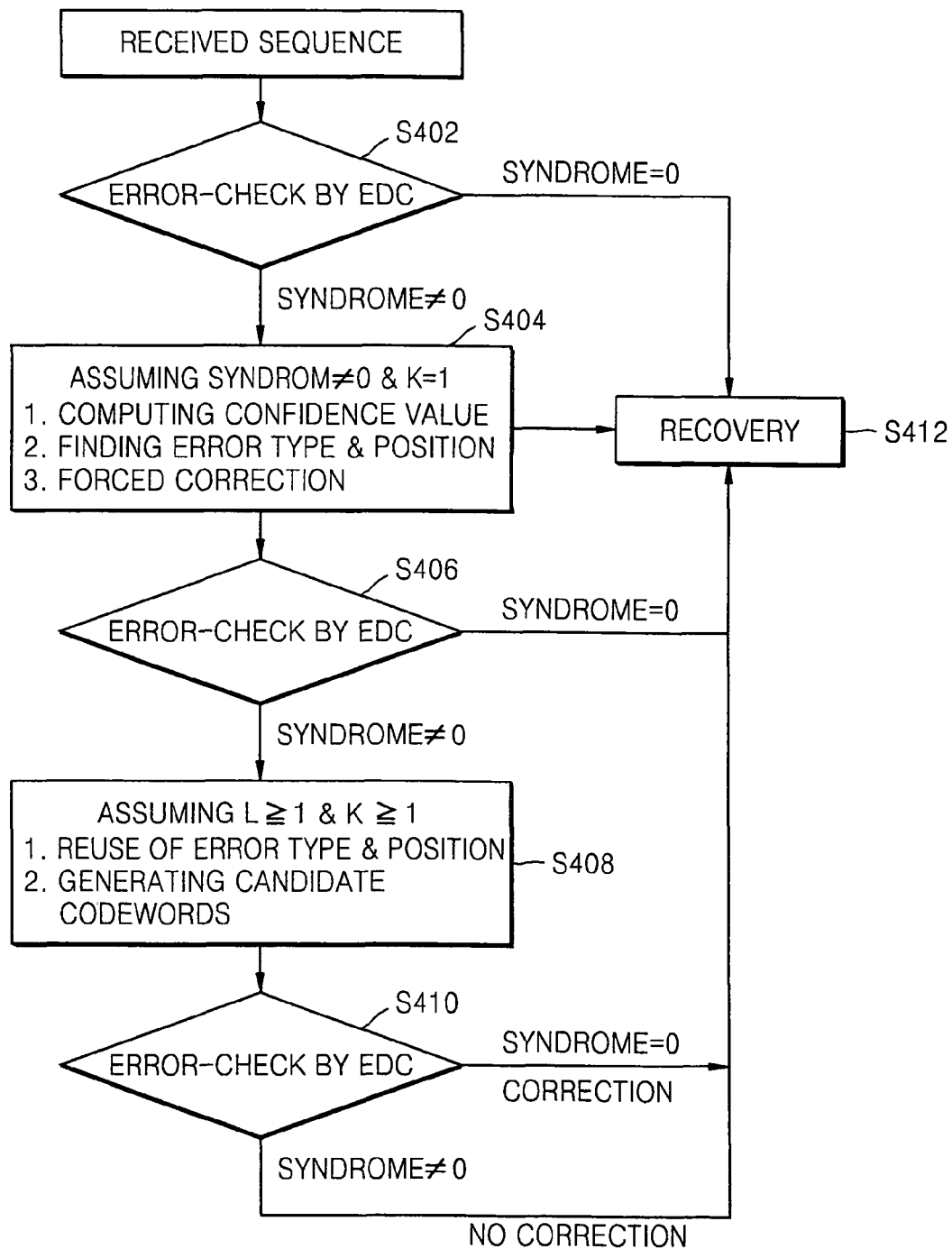
FIG. 4 is a flowchart illustrating an error correction method according to an embodiment of the present invention.

FIG. 4 is a flowchart illustrating an error correction method according to one embodiment of the present invention. Referring to FIG. 4, operations S402 and S404 are similar to respective operations S202 and S204 illustrated in FIG. 2. In particular, operation S402 is performed to determine whether or not an error pattern has occurred in a detected codeword.

In operation S402, the detected codeword is divided by a generator polynomial to produce a first syndrome. If the first syndrome is all-zero, then the detected codeword presumably contains no errors. However, if the first syndrome is not all-zero, the detected codeword presumably contains some error.

Where the detected codeword is determined to be error free, a data recovery process is performed in an operation S412 to recover original data from which the detected codeword was formed. The data recovery process typically removes redundant bits that were added to the data by the EDC encoder to form a transmitted codeword.

On the other hand, where the detected codeword is determined to contain errors in operation S402, a Post-Viterbi error correction process is performed in operation S404 to correct the errors.

Operation S404 is performed under a condition of K=1, where "K" denotes a maximum number of error patterns which are assumed to possibly exist within the detected codeword. The relation of K≦E should be satisfied, where "E" denotes a number of error pattern matched filters included in the post-Viterbi processor.

In operation S404, confidence values are computed for all possible error patterns with respect to every bit of the detected codeword using respective error pattern matched filters corresponding to respective error patterns. Here, each error pattern matched filter is configured according to dominant error patterns produced by the readback channel. The most likely error pattern and its accompanying most likely start position, as determined by the Post-Viterbi processor, are applied to the detected codeword to generate a candidate codeword.

Next, in an operation S406, the candidate codeword is again divided by a generator polynomial to produce a second syndrome. Where the second syndrome is all-zero, then the candidate codeword presumably contains no errors. However, where the second syndrome is not all-zero, the corrected codeword presumably contains some error.

Where the candidate codeword is determined to be error free, the candidate codeword is provided to the data recovery process as a corrected codeword and the data recovery process is performed in operation S412 to recover original data from the corrected codeword.

On the other hand, where the second syndrome is determined to contain errors in operation S406, the Post-Viterbi error correction process is again performed on the detected codeword in an operation S408. However, in operation S408, several potential error patterns and starting positions are taken into consideration, in addition to the error pattern having the largest confidence value to produce multiple candidate codewords. Each candidate codeword is generated by performing error correction on the detected codeword using one or more potential error patterns/starting positions.

Operation S408 is performed under conditions L≧1 and K≧1, where the term "L" denotes a number of error patterns used to generate candidate codewords, and L≦K≦E. In other words, in operation S408, one or more error patterns may occur in each candidate codeword, and other error patterns are considered besides the error pattern corresponding to the largest confidence value.

Candidate codewords can be expressed as $C_1, C_2, \ldots, C_K$, where each term $C_L$ denotes a collection of candidate codewords containing "L" error patterns. For example, the term "$C_1$" denotes a collection of candidate codewords, each generated by applying one (1) error pattern to the detected codeword, i.e., L=1. Similarly, the term "$C_2$" denotes a collection of candidate codewords, each generated by applying two (2) error patterns to the detected codeword, i.e., L=2, and so on.

After operation S408 is performed, an operation S410 is performed to determine whether any of the candidate codewords generates a syndrome equal to zero when divided by the generator polynomial. Where any one of the candidate codewords generates a syndrome equal to zero when divided by the generator polynomial, that candidate codeword is generated as a corrected codeword, and data recovery is performed on the corrected codeword in operation S412.

On the other hand, where none of the candidate codewords generates a syndrome equal to zero when divided by the generator polynomial, no error correction is performed on any of the candidate codewords. However, data recovery may still be performed on one or more of the candidate codewords using operation S412.

In sum, the method of FIG. 4 may performs error detection and/or correction multiple times when a first error detection procedure fails to produce a corrected codeword having a zero syndrome with respect to the generator polynomial. By performing the error detection and/or correction multiple times, a number of mis-corrections can be avoided, thereby reducing the bit error rate of the method relative to that of conventional methods.

FIG. 5 shows a table of results obtained by performing error detection and correction using the Post-Viterbi error correction method of FIG. 4. The table of FIG. 5 is similar to the table of FIG. 3, except that, as illustrated by the broken boxes in FIG. 5, the method of FIG. 4 was able to correctly predict and correct the actual error pattern [2, −2, 2] at actual error position [715, 716, 717], using "L=2 and K=1". In other words, by considering at least two different potential error pattern, the method of FIG. 4 was able to correctly predict the actual error pattern and error position in the detected codeword of FIG. 4.

As seen in FIG. 5, error pattern [2, −2, 2, −2] with error position [706, 706, 707, 708] has the largest confidence value. However, error pattern [2, −2, 2] with error position [715, 716, 717] is chosen as the actual error pattern and used to generate the corrected codeword.

The actual error pattern is correctly chosen by obtaining a first syndrome for a first candidate codeword obtained based on error pattern [2, −2, 2, −2] with error position [706, 706, 707, 708] and determining that the first syndrome is not zero. Next, a second syndrome is obtained for a second candidate codeword based on error pattern [2, −2, 2] with error position [715, 716, 717]. The second syndrome is zero, and therefore the second candidate codeword is used as the corrected codeword.

Where all candidate codewords have nonzero syndromes, data recovery may be performed, however, the method of FIG. 4 terminates without correcting any error pattern.

Figure 6:
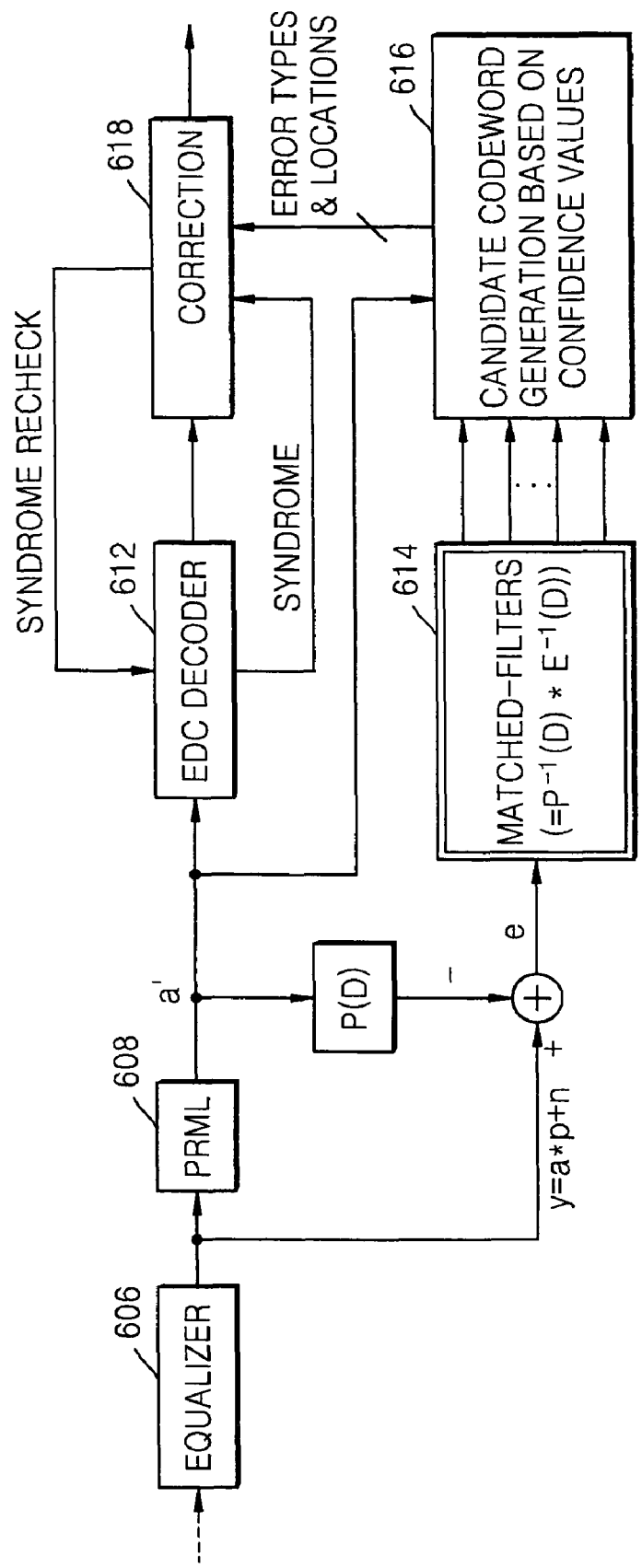
FIG. 6 is a block diagram of a Post-Viterbi processor according to an embodiment of the present invention.

FIG. 6 is a block diagram of a Post-Viterbi processor according to an embodiment of the present invention. Referring to FIG. 6, the Post-Viterbi processor comprises an equalizer unit 606, a PRML unit 608, a matched filters unit 614, an EDC decoder unit 612, a candidate codeword generation unit 616, and a correction unit 618.

Figure 1:
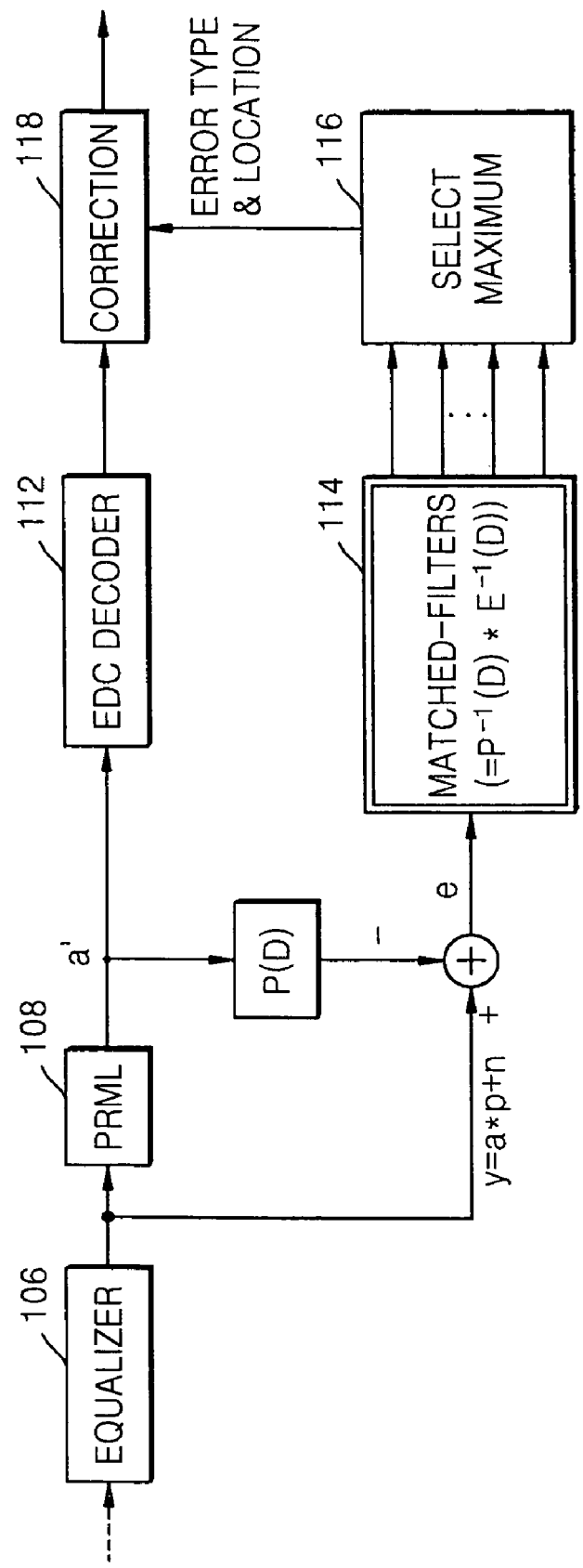
FIG. 1 is a block diagram of a conventional Post-Viterbi processor.

Similar to the Post-Viterbi processor of FIG. 1, equalizer unit 606 reshapes a readback channel output into a sequence which is matched to a partial response P(D), where "D" is a delay variable in a digital sequence, e.g., $P(D)=1+6D+7D^2+2D^3$.

PRML unit 608 detects a transmitted codeword and provides an output. An error signal 'e' is generated by subtracting an output of equalizer unit 606 and the output of PRML unit 608, convolved with partial response P(D).

EDC decoder unit 612 computes syndromes to check for the presence of errors in the detected codeword and candidate codewords. Matched-filters unit 614 comprises a plurality of error matched filters, each corresponding to a dominant error pattern and used to detect whether the detected codeword contains one of the dominant error patterns. Each error pattern matched filter calculates a likelihood or confidence value that an error pattern exists in the detected codeword and outputs the likelihood or confidence values and the associated error patterns and locations to candidate codeword generation unit 616.

Candidate codeword generation unit 616 receives the dominant error patterns and locations from matched filters unit 614 and also receives the detected codeword. Candidate codeword generation unit 616 generates one or more error patterns and locations for the detected codeword in accordance with the respective dominant error patterns and confidence or likelihood values associated with the respective dominant error patterns. Alternatively, candidate codeword generation unit 616 may apply the respective error patterns and locations to the detected codeword to generate one or more candidate codewords.

Correction unit 618 receives the one or more error patterns and locations, or alternatively, the one or more candidate codewords, from candidate codeword unit 616. In addition, correction unit 618 typically receives the detected codeword. Correction unit 618 may therefore store the one or more candidate codewords or apply the one or more error types and locations to the detected codeword to generate one or more candidate codewords. Correction unit 618 outputs the one or more candidate codewords to EDC decoder unit 612, and EDC decoder unit 612 performs error detection on the one or more candidate codewords by dividing each candidate codeword by the generator polynomial to produce a corresponding syndrome. The syndromes are output from EDC decoder unit 612 to correction unit 618. Where a particular candidate codeword has a zero syndrome, correction unit 618 outputs that candidate codeword as a corrected codeword upon receiving the zero syndrome from EDC decoder unit 612.

Where candidate codeword generator 616 generates the candidate codewords, the candidate codewords are typically generated in combinations as described above. For example, the candidate codewords can be generated as $C_1, C_2, \ldots, C_K$ based on confidence values output by matched filters unit 614.

In one embodiment, correction unit 618 selects a candidate codeword having no errors from among multiple candidate codewords generated by candidate codeword generator 616. Where each of the plurality of candidate codewords includes errors, the detected codeword may be output from correction unit 618 without any correction.

Correction unit 618 typically sends requests for EDC decoder unit 612 to produce syndromes for the candidate codewords. EDC decoder unit 612 applies EDC to each of the candidate codewords, computes the syndromes, and outputs results obtained by computing the syndromes to correction unit 618. Correction unit 618 selects the candidate codeword having no errors based on the syndromes and outputs the selected candidate codeword as the corrected codeword.

Figure 7:
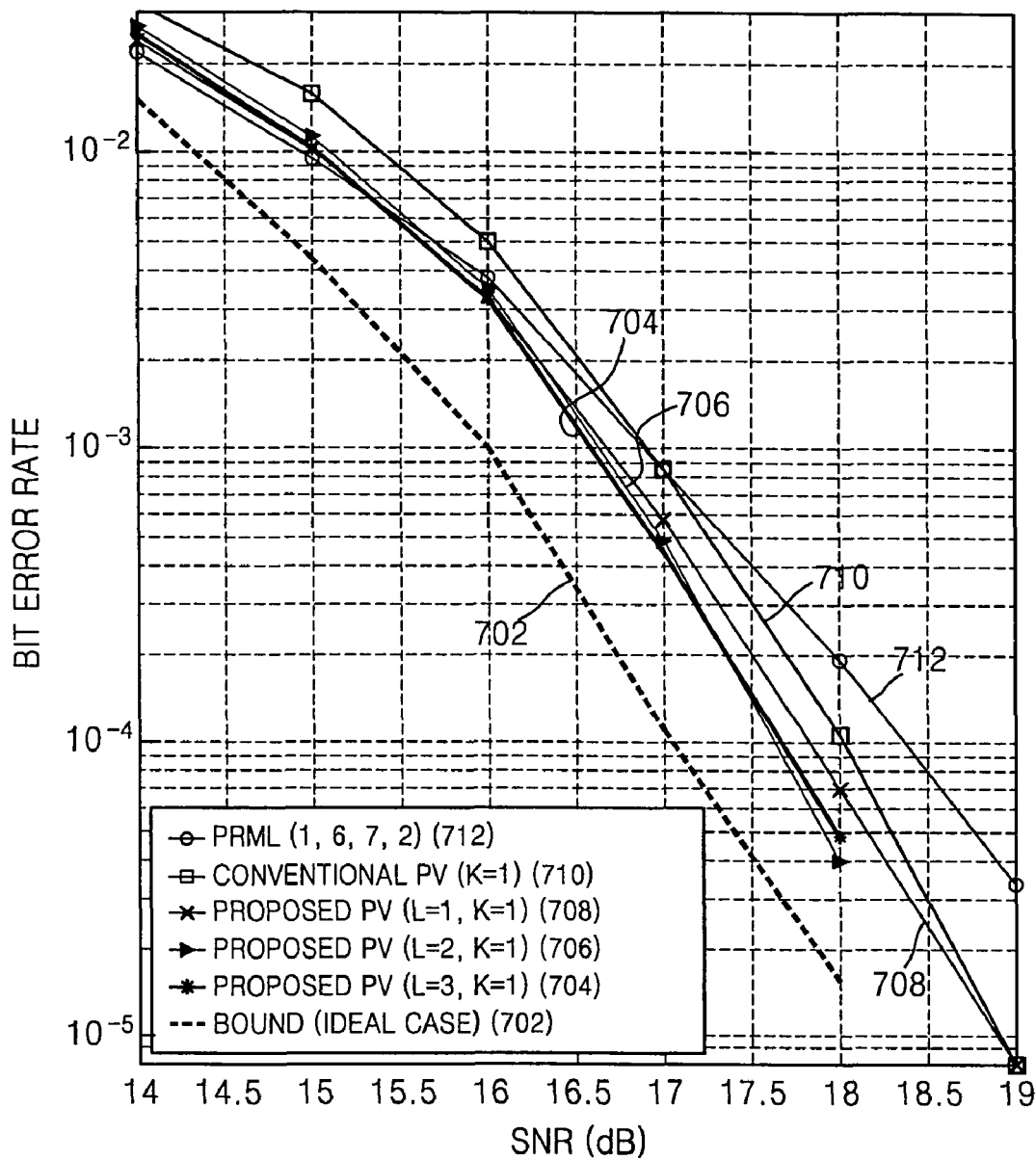
FIG. 7 is a graph illustrating bit error rates of data streams employing conventional error correction techniques and error correction techniques according to an embodiment of the invention, respectively.

FIG. 7 is a graph illustrating bit error rates (BERs) of data streams employing conventional error correction techniques and error correction techniques according to an embodiment of the invention, respectively. In FIG. 7, a vertical axis measures BERs and a horizontal axis measures signal to noise ratios (SNRs). Data in the graph of FIG. 7 was produced performing simulations under conditions K=1, L=1, 2, 3, and using a partial response polynomial P=[1 6 7 2].

A curve 702 represents indicates a theoretical ideal performance for a Post-Viterbi processor. Curves 704 through 708 represent performances of the Post-Viterbi error correction methods according to embodiments of the present invention. A curve 710 represents the performance of the conventional Post-Viterbi error correction method illustrated in FIG. 2. A curve 712 represents the performance of a system not using Post-Viterbi error correction.

Figure 8:
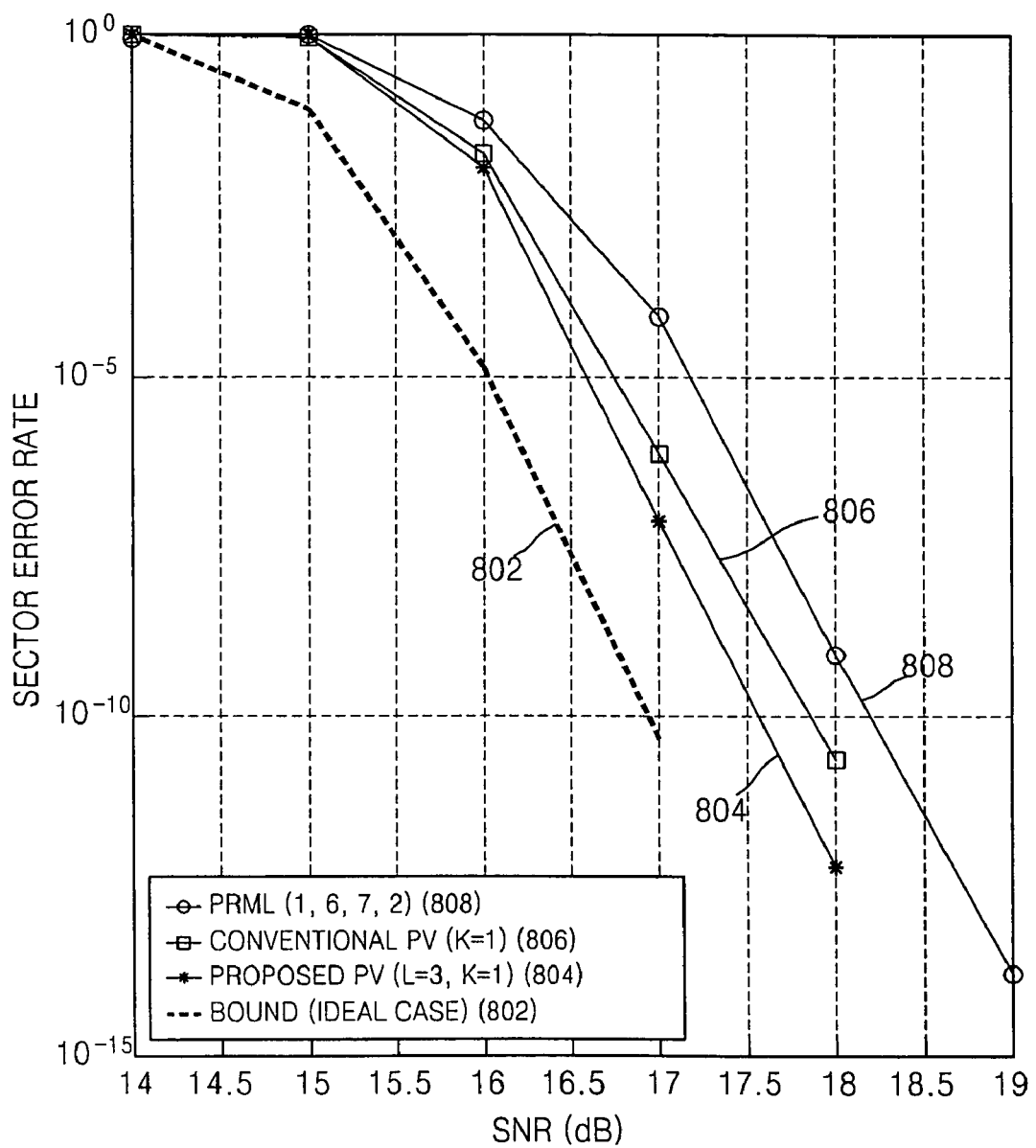
FIG. 8 is a graph illustrating sector error rates of data streams employing conventional error correction techniques and error correction techniques according to an embodiment of the invention, respectively.

FIG. 8 is a graph illustrating sector error rates (SERs) of data streams employing conventional error correction techniques and error correction techniques according to an embodiment of the invention, respectively. In FIG. 8, a vertical axis measures SERs and a horizontal axis measures SNRs. Data in FIG. 8 is generated from a simulation performed under conditions K=1, L=3, and using a partial response polynomial P=[1 6 7 2].

A curve 802 represents a theoretical ideal performance of a Post-Viterbi processor. A curve 804 represents performance of a Post-Viterbi error correction method according to an embodiment of the invention (L=3, K=1). A curve 806 represents performance of a conventional Post-Viterbi error correction method illustrated in FIG. 2. A curve 808 represents performance of a system without Post-Viterbi error correction.

As illustrated by FIG. 8, SERs are improved when the Post-Viterbi error correction is applied using embodiments of the invention rather than conventional Post-Viterbi error correction methods.

According to selected embodiments of the invention, Post-Viterbi error correction methods perform error detection by evaluating multiple candidate codewords using multiple different potential error patterns until a candidate codeword having an all-zero syndrome is identified. The candidate codeword having the all-zero syndrome is then output by the methods as a corrected codeword. By evaluating multiple candidate codewords in this way, mis-correction of error patterns tends to be avoided, and proper correction of error patterns tends to increase, thereby lowering the overall bit error rate or sector error rate of the methods. Finally, where no candidate codeword having an all-zero syndrome is identified, error correction is not perform, which also eliminates the problem of mis-correction.

The foregoing exemplary embodiments are teaching examples. Those of ordinary skill in the art will understand that various changes in form and details may be made to the exemplary embodiments without departing from the scope of the invention as defined by the claims.

What is claimed:

1. A method of correcting one or more errors in a detected codeword, the method comprising:
generating a first candidate codeword by applying a first error pattern to a first position in the detected codeword based on a likelihood that the first error pattern exists in the detected codeword at the first position;
detecting an error in the first candidate codeword;

generating a second candidate codeword by applying a second error pattern to a second position in the detected codeword based on a likelihood that the second error pattern exists in the detected codeword at the second position;

determining whether the second candidate codeword contains an error; and, upon determining that the second candidate codeword does not contain an error, selecting the second candidate codeword as a corrected codeword.

2. The method of claim 1, wherein the likelihood that the first error pattern exists in the detected codeword at the first position is greater than the likelihood that the second error event exists in the detected codeword at the second position.

3. The method of claim 1, further comprising:

upon determining that the second candidate codeword does contain an error, outputting the detected codeword without modification.

4. The method of claim 1, wherein the method is performed by a Post-Viterbi processor comprising "E" event matched filters adapted to generate "E" potential error patterns in relation to the detected codeword;

wherein the first and second candidate codewords form part of a plurality of candidate codewords $C_1, C_2, \ldots, C_K$, where "K" denotes a maximum number of error events in the codeword, each term $C_L$ denotes a collection of candidate codewords including "L" error patterns, and $L \leq K \leq E$.

5. The method of claim 4, wherein the "E" potential error patterns are dominant error patterns for a communication channel.

6. The method of claim 1, wherein applying the first error pattern to the first position in the detected codeword comprises correcting the first error pattern in the detected codeword; and, wherein applying the second error pattern to the second position in the codeword comprises correcting the second error pattern in the detected codeword.

7. The method of claim 1, wherein detecting the error in the second candidate codeword comprises:

generating a syndrome based on the second candidate codeword; and, determining whether the syndrome is all-zero.

8. A method of correcting one or more errors in a detected codeword, the method comprising:

generating N candidate codewords (n>1) by applying a plurality of error patterns to the detected codeword at a corresponding plurality of respective start positions;

determining whether any of the N candidate codewords is free of errors; and, upon determining that an i-th candidate codeword among the N candidate codewords is free of errors, generating the i-th candidate codeword as a corrected codeword.

9. The method of claim 8, further comprising:

upon determining that none of the N candidate codewords is free of errors, outputting the detected codeword without modification.

10. The method of claim 8, wherein the method is performed by a Post-Viterbi processor comprising "E" event matched filters adapted to generate "E" potential error patterns in relation to the detected codeword; and, wherein the N candidate codewords comprise candidate codewords $C_1, C_2, \ldots, C_K$, where "K" denotes a maximum number of error events in the codeword, each term $C_L$ denotes a collection of candidate codewords including "L" error patterns, and $L \leq K \leq E$.

11. The method of claim 8, wherein the generating N candidate codewords (n>1) by applying the plurality of error patterns to the detected codeword at the corresponding plurality of respective start positions comprises:

by operation of a matched filters unit, generating the plurality of error patterns as a set of most likely error patterns in the detected codeword; and, by operation of a candidate codeword generation unit, modifying the detected codeword according to the plurality of error patterns and the corresponding plurality of respective start positions to generate the N candidate codewords.

12. The method of claim 8, wherein determining whether any of the N candidate codewords is free of errors comprises:

computing N syndromes corresponding to the N candidate codewords; and, determining whether any of the N syndromes is all-zero.

13. A Post-Viterbi processor adapted to correct an error pattern in a detected codeword by applying dominant error patterns of a communication channel to the detected codeword, the Post-Viterbi processor comprising:

an error detection code (EDC) decoder adapted to detect whether the detected codeword contains errors;

a matched filters unit comprising a plurality of error pattern matched filters, each adapted to compute a confidence value corresponding to a likelihood that corresponding error pattern exists in the detected codeword;

a candidate codeword generation unit adapted to generate a plurality of candidate codewords based on the confidence values computed by the error pattern matched filters; and, a correction unit adapted to generate one of the plurality of candidate codewords as a corrected codeword upon a determination by the EDC decoder that the one of the plurality of candidate codewords does not contain errors.

14. The Post-Viterbi processor of claim 13, wherein where all of the plurality of candidate codewords contain one or more errors, the correction unit outputs the detected codeword without modification.

* * * * *